(12) United States Patent
Okumura et al.

(10) Patent No.: US 7,714,369 B2
(45) Date of Patent: May 11, 2010

(54) SEMICONDUCTOR CHIP HAVING A PHOTODIODE

(75) Inventors: Yoichi Okumura, Tokyo (JP); Ryoichi Kojima, Saitama (JP)

(73) Assignee: Texas Instruments Incorporated, Dallas, TX (US)

( * ) Notice: Subject to any disclaimer, the term of this patent is extended or adjusted under 35 U.S.C. 154(b) by 178 days.

(21) Appl. No.: 11/536,127

(22) Filed: Sep. 28, 2006

(65) Prior Publication Data

US 2007/0096177 A1    May 3, 2007

(30) Foreign Application Priority Data

Oct. 3, 2005    (JP) .............................. 2005-289708

(51) Int. Cl.
| | | |
|---|---|---|
| H01L 31/062 | (2006.01) | |
| H01L 31/113 | (2006.01) | |
| H01L 27/148 | (2006.01) | |
| H01L 29/768 | (2006.01) | |
| H01L 31/00 | (2006.01) | |
| H01L 31/06 | (2006.01) | |
| H01L 23/06 | (2006.01) | |
| H01L 23/48 | (2006.01) | |
| H01L 23/52 | (2006.01) | |
| H01L 29/40 | (2006.01) | |

(52) U.S. Cl. ....................... 257/292; 257/233; 257/293; 257/459; 257/461; 257/684; 257/737; 257/E23.021; 257/E25.032; 257/E31.115

(58) Field of Classification Search ................. 257/233, 257/292–293, 459, 461, 684, 737, E23.021, 257/E25.032, E31.115
See application file for complete search history.

(56) References Cited

U.S. PATENT DOCUMENTS

| 5,939,773 | A | * | 8/1999 | Jiang et al. ................... 257/666 |
|---|---|---|---|---|
| 6,005,276 | A | * | 12/1999 | Forrest et al. ................ 257/432 |
| 6,301,401 | B1 | * | 10/2001 | La ............................... 385/14 |
| 6,649,949 | B2 | * | 11/2003 | Okada ......................... 257/292 |
| 6,873,034 | B2 | * | 3/2005 | Nakamura et al. ........... 257/680 |
| 6,890,789 | B2 | * | 5/2005 | Ono et al. ...................... 438/64 |
| 6,921,018 | B2 | * | 7/2005 | Ference et al. ............... 228/246 |
| 6,921,956 | B2 | * | 7/2005 | Yang et al. ................... 257/432 |
| 7,005,719 | B2 | * | 2/2006 | Masumoto .................... 257/432 |
| 7,141,869 | B2 | * | 11/2006 | Kim et al. .................... 257/673 |
| 2001/0005047 | A1 | * | 6/2001 | Jimarez et al. ............... 257/687 |
| 2005/0002618 | A1 | * | 1/2005 | Miyamae et al. .............. 385/88 |
| 2008/0009098 | A1 | * | 1/2008 | Lee et al. ..................... 438/109 |

* cited by examiner

*Primary Examiner*—Ida M Soward
(74) *Attorney, Agent, or Firm*—Jacqueline J. Garner; Wade J. Brady, III; Frederick J. Telecky, Jr.

(57) ABSTRACT

A semiconductor chip that has a photodiode formed on it, a semiconductor device including the semiconductor chip, and manufacturing methods thereof. A second semiconductor region 11 is formed in light-receiving region R of first semiconductor region 10. First bumps 12 are formed outside light-receiving region R. Second bump 13 is formed in a ring-shape around light-receiving region R between region R and first bumps 12. Semiconductor chip T is assembled on assembly substrate S, and resin layer 30 is formed between chip T and substrate S in the region outside of said light-receiving region R.

9 Claims, 4 Drawing Sheets

SEMICONDUCTOR CHIP HAVING A PHOTODIODE

FIELD OF THE INVENTION

The present invention pertains to a type of semiconductor chip, a type of semiconductor device, and manufacturing methods thereof. Especially, the present invention pertains to a type of semiconductor chip having a photodiode, the corresponding semiconductor device, and the manufacturing methods thereof.

BACKGROUND OF THE INVENTION

In semiconductor devices, photodiodes, a type of diode that receives light and generates current, are widely used as the light-receiving element for an optical pickup device contained in a CD, DVD and other optical disk devices. The photodiode is made of a pn-junction semiconductor. When a reverse bias is applied to the pn junction, the depletion layer becomes wider, and a high electric field forms. Due to the light absorbed mainly by the depletion layer, electron-hole pairs are generated, and electrons attracted by the electric field move to the n-type semiconductor region, while the holes move to the p-type semiconductor region, and they are detected as current.

The aforementioned photodiodes include the following types: a PIN photodiode, which has an intrinsic layer, such as a p⁻ layer or n⁻ layer containing a low-concentration electroconductive impurity set between the p-layer and n-layer, and a depletion layer that can spread easily under a low voltage, and an avalanche photodiode that has a region where avalanche breakdown takes place. For example, the aforementioned photodiodes are disclosed in Japanese Kokai Patent Application No. 2001-320079.

It is well known that when said photodiode is assembled on an assembly substrate, the structure is sealed, e.g., with a clear molding resin. FIG. 5 is a cross-sectional view illustrating an example of a semiconductor device with said structure with clear molding resin applied for sealing after said photodiode is assembled on the assembly substrate.

For example, n-type semiconductor layer 101 is formed on the outer layer portion in the light-receiving region of p-type semiconductor substrate 100, and it is connected to a photodiode or the like. Then, pad electrode 102 is formed on the surface of semiconductor substrate 100 to form semiconductor chip T with a photodiode formed on it. By means of adhesive film 103, semiconductor chip T with said constitution is mounted on assembly substrate 104. Substrate electrode 105 is formed on assembly substrate 104, and, by means of wire bonding 106, pad electrode 102 of semiconductor chip T and substrate electrode 105 of assembly substrate 104 are connected.

Also, resin layer 107 made of a clear molding resin is formed to seal substrate electrode 105 and wire bonding 106 in the region connected to semiconductor chip T and wire bonding 106. Said resin layer 107 is made of a resin that is at least transparent to light received by the photodiode, and it can protect the photodiode and the wiring connecting portion without impeding the incidence of light.

The semiconductor device with photodiode assembled as aforementioned should have an area appropriate for connection with the wire bonding. Also, the resin layer of the clear molding resin is thick, such that it is difficult to reduce the overall size of the device. This is undesirable. Also, the manufacturing method has many steps of operation, and it is difficult to cut the manufacturing cost, and this is undesirable.

SUMMARY OF THE INVENTION

The objective of the present invention is to solve the aforementioned problems of the prior art by providing a type of semiconductor chip, which has a photodiode formed on it and can have a smaller size and a lower manufacturing cost when it is assembled on the assembly substrate, a type of semiconductor device formed by assembling said semiconductor chip on an assembly substrate, as well as their manufacturing methods.

In order to realize the aforementioned objective, the present invention provides a type of semiconductor chip having a first semiconductor region of a first electroconductive type and a second semiconductor region of a second electroconductive type and located at a surface of the first semiconductor region in a light-receiving region. The first and second semiconductor regions form a photodiode. First bumps are formed on a principal surface of the first semiconductor region in a region outside the light-receiving region. A second bump formed in a ring-shape around the light-receiving region between the light-receiving region and the first bumps.

In addition, in order to realize the aforementioned objective, the present invention provides a type of semiconductor device comprising a semiconductor chip, an assembly substrate, and a resin layer. The semiconductor chip has a first semiconductor region of a first electroconductive type and a second semiconductor region of a second electroconductive type and formed at a surface of said first semiconductor region in a light-receiving region. The first and second semiconductor regions forming a photodiode. First bumps are formed on a principal surface of the first semiconductor region in a region outside the light-receiving region. A second bump is formed in a ring-shape around the light-receiving region between the light-receiving region and the first bumps. The assembly substrate has electrodes formed at a surface thereof and the semiconductor chip is assembled on the assembly substrate with the first bumps and second bump connected to the electrodes of the assembly substrate. The resin layer is formed between the semiconductor chip and the assembly substrate in a region outside of the light-receiving region, wherein the resin layer bonds the semiconductor chip and the assembly substrate.

In order to realize the aforementioned objective, the present invention also provides a manufacturing method for a semiconductor chip comprising the steps of forming a first semiconductor region of a first electroconductive type on a substrate and forming a second semiconductor region of a second electroconductive type on the first semiconductor region in a light-receiving region. The first and second semiconductor regions form a photodiode. Then, first bumps are formed on a principal surface of the first semiconductor region in a region outside the light-receiving region and a second bump is formed in a ring-shape around the light-receiving region between the light-receiving region and the first bumps.

In order to realize the aforementioned objective, the present invention provides a manufacturing method for a semiconductor device comprising the steps of forming a semiconductor chip, assembling the semiconductor chip on an assembly substrate and forming a resin layer. The semiconductor chip formation comprises forming a first semiconductor region of a first electroconductive type and forming a second semiconductor region of a second electroconductive type at a surface of the first semiconductor region in a light-receiving region. The first and second semiconductor regions form a photodiode. First bumps are formed on a principal surface of the first semiconductor region in a region outside the light-receiving region and a second bump is formed in a ring-shape around the light-receiving region between the light-receiving region and the first bumps. The semiconductor chip is assembled on an assembly substrate with electrodes by connecting the first bumps and the second bump to the electrodes of the assembly substrate. The resin layer is formed between the semiconductor chip and the assembly substrate in a region outside of the light-receiving region.

BRIEF DESCRIPTION OF THE DRAWINGS

FIG. 1(A) is a plan view of a semiconductor chip pertaining to Embodiment 1 of the present invention. FIG. 1(B) is a cross-sectional view taken across X-X' of FIG. 1(A).

FIG. 2(A) and FIG. 2(B) are cross-sectional views illustrating the semiconductor device in Embodiment 1 of the present invention.

FIG. 3(A) and FIG. 3(B) are cross-sectional views illustrating the semiconductor device in Embodiment 2 of the present invention.

FIG. 4(A) is a plan view of the semiconductor chip in Embodiment 3 of the present invention. FIG. 4(B) is a cross-sectional view taken across X-X' of FIG. 4(A).

REFERENCE NUMERALS AND SYMBOLS AS SHOWN IN THE DRAWINGS

In the figures, 10 represents a first semiconductor region, 11 a second semiconductor region, 12 first bumps, 13, 13a a second bump, 20 a flexible board (assembly-substrate main body), 20a a through-opening, 21 a stiffener, 22 an assembly substrate electrode, 30 a resin layer, 40 a protective layer, 100 a p-type semiconductor substrate, 101 an n-type semiconductor layer, 102 a pad electrode, 103 an adhesive film, 104 an assembly substrate, 105 a substrate electrode, 106 a wire bonding, 107 a resin layer, R a light-receiving region, S an assembly substrate, and T a semiconductor chip.

DESCRIPTION OF THE EMBODIMENTS

The semiconductor chip and semiconductor device of the present invention can have a smaller size and a lower manufacturing cost. Also, according to the manufacturing method of the present invention, assembly on the assembly substrate allows for a smaller size and a lower manufacturing cost.

Figure 1:
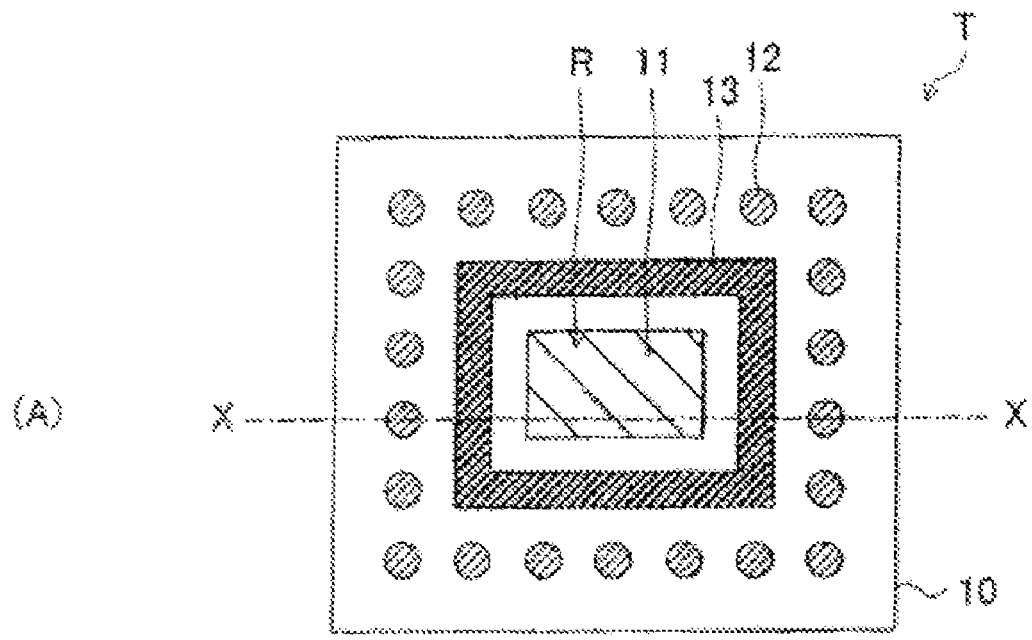
FIG. 1.
Figure 1:
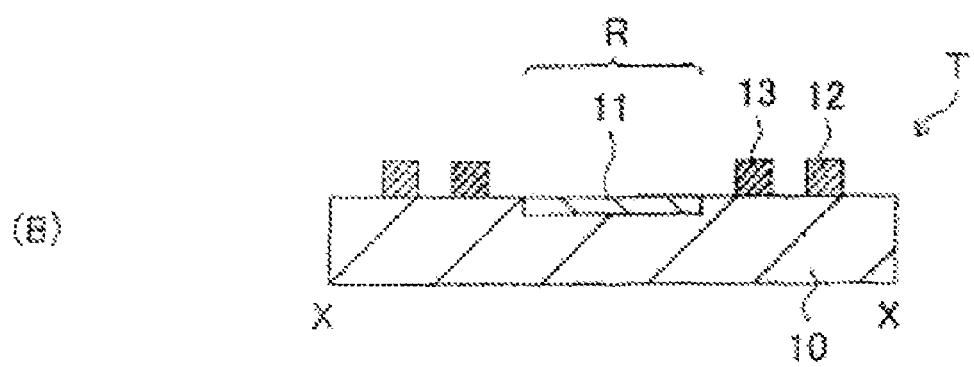

In the following, an explanation will be given regarding embodiment of the semiconductor device and its manufacturing method of the present invention with reference to figures. FIG. 1(A) is a plan view as seen from the side of the bumps of semiconductor chip T having a photodiode in the present embodiment. FIG. 1(B) is a cross-sectional view taken across X-X' in FIG. 1(A). First semiconductor region 10 may comprise a p$^{++}$-type conductivity (e.g., first electroconductive type) substrate. In the light-receiving region R of the first semiconductor region 10, second semiconductor region 11 is formed. Second semiconductor region 11 comprises an n-type (second electroconductive type) semiconductor layer. A photodiode made of a pn junction is thus formed. That is, the formation region of second semiconductor region 11 becomes light-receiving region R.

On the principal surface of first semiconductor region 10 in a region outside light-receiving region R, first bumps 12 are formed for signal input/output of the photodiode. Between the light-receiving region on first semiconductor region 10 and the first bumps 12, second bump 13 is formed in a ring-shape around the outer periphery of light-receiving region R. Second bump 13 may have a floating potential or a constant potential of the ground potential or power source potential applied to it. First bumps 12 and second bump 13 may be formed as solder bumps and it is preferred that first bumps 12 and second bump 13 have nearly the same height. In this embodiment, light-receiving region R is formed with a rectangular layout, and second bump 13 is formed in a rectangular contour. An electrode pad (not shown) may be formed in the layer below the first and second bumps.

Figure 2:
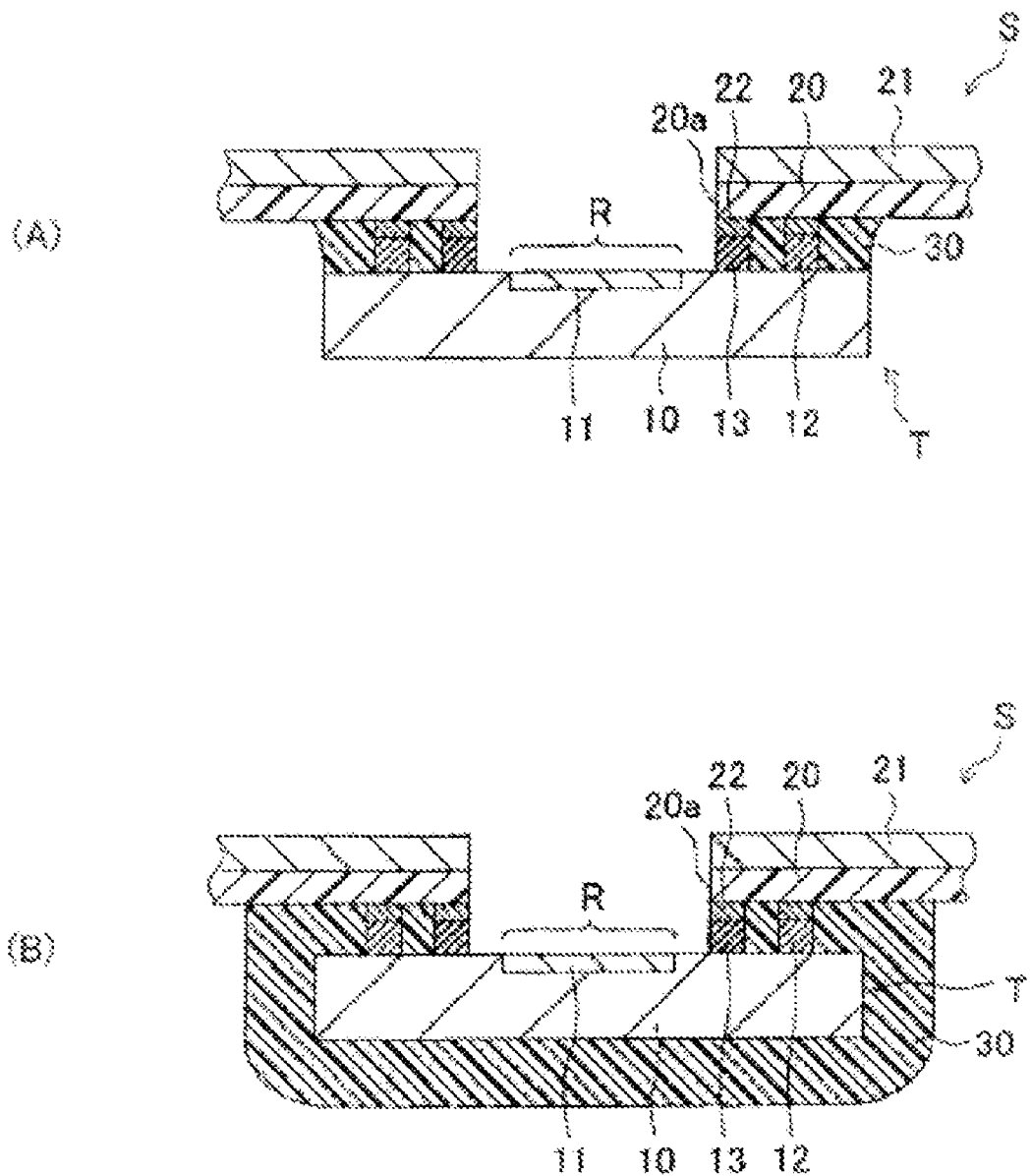
FIG. 2.

FIG. 2(A) is a cross-sectional view of the semiconductor device in the present embodiment. In this constitution, semiconductor chip T is assembled on assembly substrate S. For example, assembly substrate S is prepared by bonding reinforcing stiffener 21 made of aluminum, stainless steel, acrylic resin, or the like onto flexible board (main body of assembly substrate) 20. A through-opening 20a is formed to fit light-receiving region R of semiconductor chip T, and electrodes 22 for the assembly substrate are formed as a pattern. The first bumps 12 and second bump 13 of semiconductor chip T with said constitution are connected to assembly substrate electrodes 22, and semiconductor chip T is assembled on assembly substrate S so that it faces the light-receiving region from through-opening 20a.

A resin layer 30 is formed between semiconductor chip T and assembly substrate S for bonding semiconductor chip T and assembly substrate S. Resin layer 30 is formed outside of light-receiving region R. By means of the adherence of resin layer 30, the bonding strength between assembly substrate S and semiconductor chip T is further increased. Here, the joint portion between second bump 13 and assembly substrates electrodes 22 acts as a dike, and resin layer 30 is not formed to cover light-receiving region R.

Semiconductor chip T in this embodiment can be assembled on the assembly substrate with a flip chip. The device can be made smaller and the second bump can be formed without increasing the number of steps of operation and in the same operation as that of the first bumps. Furthermore, the wire-bonding operation step can be omitted. The resin layer can be performed using a dispenser, bonding, etc.; and the manufacturing cost can be cut. For the semiconductor device in the present embodiment, since the assembly is constituted on the assembly substrate, it is possible to reduce the size and to cut the manufacturing cost.

In the following, an explanation will be given regarding the manufacturing method of said semiconductor chip and semiconductor device. First of all, for example, on the outer layer of first semiconductor region 10 as a p$^{++}$-type semiconductor substrate, on the region as light-receiving region R of the photodiode, second semiconductor region 11, containing the intrinsic layer and an n-type (second electroconductive type) semiconductor layer, etc., is formed. Then, on the principal surface of first semiconductor region 10 in a region outside light-receiving region R, first bumps 12 are formed. Also, ring-shaped second bump 13 is formed around the outer periphery of light-receiving region R between light-receiving region R and the first bumps 12. Here, it is preferred that first bumps 12 and second bump 13 be formed at the same time. As a result, it is possible to form first bumps 12 and second bump 13 with nearly the same height easily, and it is possible to form second bump 13 without increasing the number of steps of operation. This can cut the manufacturing cost. Using the aforementioned process, it is possible to manufacture the semiconductor chip of the present embodiment.

In the following, an explanation will be given regarding the manufacturing method of a semiconductor device having said semiconductor chip assembled on the assembly substrate. For example, assembly substrate S is prepared by bonding stiffener 21 onto flexible board 20, followed by forming through-opening 20a to fit light-receiving region R and by forming of assembly substrate electrodes 22 as a pattern on the surface. On this assembly substrate, semiconductor chip T is assembled by connecting first bumps 12 and second bump 13 to substrate electrodes 22 such that said chip faces light-receiving region R from through-opening 20a. For said assembly substrate S, for example, the through-opening may be formed by punching flexible board 20, and stiffener 21 also having a through-opening in the same shape and prepared in another step of operation is then bonded. Said assembly substrate electrodes 22 may be formed before or after said bonding.

Then, resin layer 30 for bonding semiconductor chip T and assembly substrate S is formed between semiconductor chip T and assembly substrate S in the region on the side of first bumps 12 with respect to second bump 13. As resin layer 30, for example, one may make use of an epoxy-based or polyamide-based resin or various other types of resins. It does not have to be transparent to light in order for light to be received by the photodiode. For example, resin layer 30 may be formed by feeding from a dispenser or the like in the side filling configuration. In the operation step for forming resin layer 30 as aforementioned, the second bump becomes a dike of the resin layer. That is, because the joint portion between second bump 13 and assembly substrate electrodes 22 becomes a dike, resin layer 30 is not formed to cover light-receiving region R.

In the manufacturing method of the semiconductor chip and semiconductor device in the aforementioned embodiment, the second bump can be formed in the same operation as that for the first bumps without increasing the number of steps of operation. By assembling semiconductor chip T on the assembly substrate as a flip chip, it is possible to omit the wire-bonding step, etc., and the device size can be made smaller. Also, the resin layer can be formed by using a dispenser or potting, and the manufacturing cost can be cut.

As shown in FIG. 2(B), a cross-sectional view, in the semiconductor device shown in FIG. 2(A), resin layer 30 is formed not only between semiconductor chip T and assembly substrate S, but it also covers the entire back surface opposite the bump-forming surface of semiconductor chip T.

As the manufacturing method of the semiconductor device shown in FIG. 2(B), in the operation step for forming resin layer 30, the resin is fed by means of potting. Otherwise, the manufacturing method is the same as the aforementioned manufacturing method.

Figure 3:
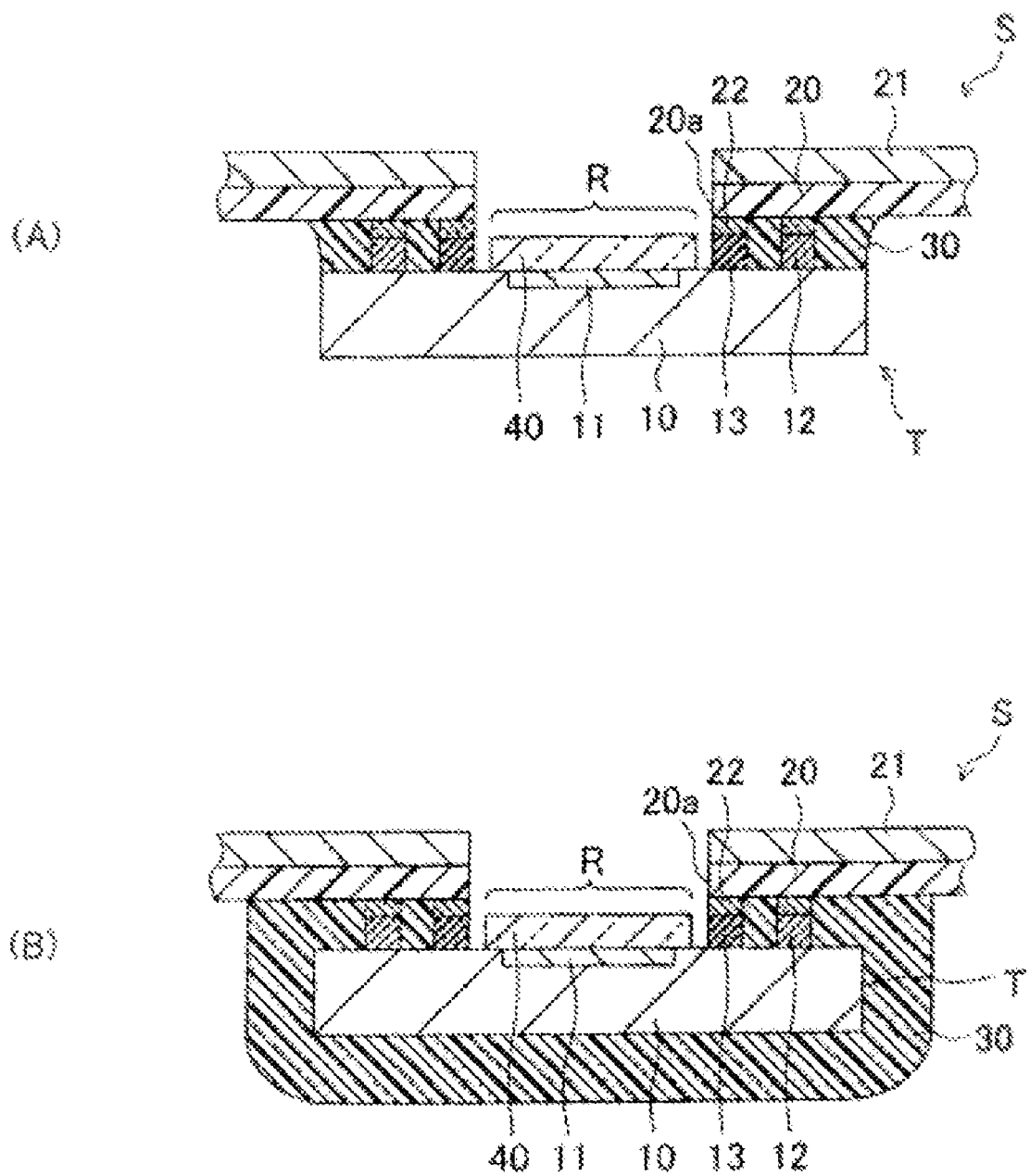
FIG. 3.

FIG. 3(A) is a cross-sectional view of a semiconductor device in the present embodiment. In the semiconductor device shown in FIG. 2(A), the constitution has protective layer 40 made of a clear molding resin formed to protect light-receiving region R of semiconductor chip T. Otherwise, the constitution is substantially identical to that of the semiconductor device pertaining to Embodiment 1 with the structure shown in FIG. 2(A).

Just as in Embodiment 1, the semiconductor device in this embodiment can be formed by assembling on the assembly substrate, so that the size can be reduced and the manufacturing cost can be cut. The semiconductor device in this embodiment can be manufactured by means of the same method as that used for Embodiment 1, except that it also has protective layer 40 made of the clear molding resin formed to protect light-receiving region R of semiconductor chip T.

As shown in FIG. 3(B), a cross-sectional view, in the semiconductor device shown in FIG. 3(A), resin layer 30 is formed not only between semiconductor chip T and assembly substrate S, but also to cover the entire inner surface of the bump forming surface on semiconductor chip T. As the manufacturing method of the semiconductor device shown in FIG. 3(B), in the operation step for forming resin layer 30, the resin is fed by means of potting.

Figure 4:
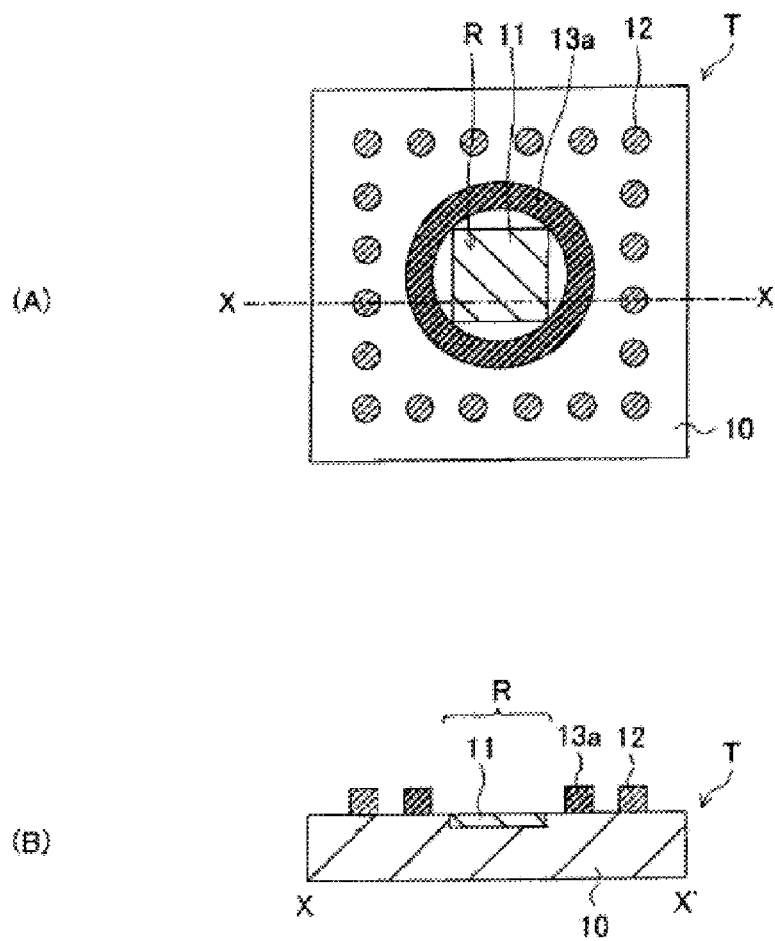
FIG. 4.
Figure 5:
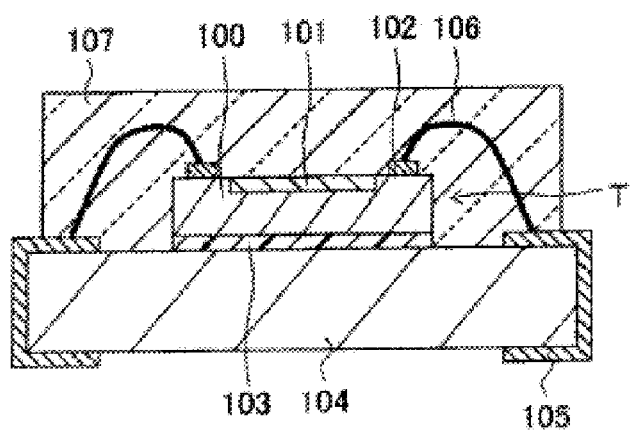
FIG. 5 is a cross-sectional view of a semiconductor device in the prior art.

FIG. 4(A) is a plan view as seen from the side of the bumps of semiconductor chip T having a photodiode in this embodiment. FIG. 4(B) is a cross-sectional view taken across X-X' in FIG. 4(A). For example, on the outer surface portion in light-receiving region R of first semiconductor region 10, a $p^{++}$-type (first electroconductive type) semiconductor substrate, second semiconductor region 11 containing the intrinsic layer, n-type (second electroconductive type) semiconductor layer, etc., is formed, and, by means of the pn junction, a photodiode is formed. That is, the formation region of second semiconductor region 11 becomes light-receiving region R. Also, for example, on the principal surface of first semiconductor region 10 outside light-receiving region R, first bumps 12 for input/output of the photodiode signal is formed.

In addition, for example, between the light-receiving region and the formation region of first bumps 12 on the principal surface of first semiconductor region 10, second bump 13a is formed in a ring-shape around the outer periphery of light-receiving region R, and a floating potential or a constant potential of the ground or the power source potential is applied to it. In this embodiment, said light-receiving region R has a rectangular layout, and second bump 13a is formed in a round shape surrounding said rectangular shape. The layout of second bump 13 is not limited to the aforementioned types. In addition to the rectangular shape in said Embodiment 1 and the round shape as explained above, it may also have an elliptic shape or square shape, etc., and there is no specific restriction on it.

The semiconductor chip pertaining to the present embodiment can be assembled as a flip chip on the assembly substrate. It is possible to reduce the size of the device. Also, the second bump can be formed during the same operation as that for the first bumps without increasing the number of steps of operation; wire bonding and other steps can be omitted; and the resin layer may be formed by means of a dispenser or potting, so that the manufacturing cost can be cut. For the semiconductor device with said semiconductor chip assembled on the assembly substrate, it is possible to realize a smaller size and a lower manufacturing cost.

The present invention is not limited to the aforementioned. For example, the first bumps and the second bump may be formed as gold bumps, or as other bump structures. In the aforementioned example, a structure with flexible board 20 and stiffener 21 bonded to each other is used as assembly substrate S. However, the assembly substrate is not limited to this structure. For example, one may also use a glass epoxy substrate or another substrate.

In the example presented above, the second bump is formed with the same material as that used for the first bumps. However, any material that can play the role of a dike for stopping resin layer 30 may be used, such as non-electroconductive plastics and other materials, as well as materials other than electroconductive solder. Various other modifications may be used, as long as the gist of the present invention is observed.

The semiconductor chip of the present invention can be adopted in a semiconductor device having a photodiode. The semiconductor device of the present invention can be adopted in a semiconductor device with a semiconductor chip having a photodiode assembled on it. The manufacturing method of a semiconductor chip of the present invention can be adopted in a method for manufacturing a semiconductor chip having a photodiode. The manufacturing method of a semiconductor device of the present invention can be adopted in a feed material method in which a semiconductor chip having a photodiode is assembled on an assembly substrate.

The invention claimed is:

1. A semiconductor chip having a photodiode formed thereon, comprising:
    a first semiconductor region of a first electroconductive type;
    a second semiconductor region of a second electroconductive type and located at a surface of said first semiconductor region in a light-receiving region, said first and second semiconductor regions forming said photodiode;
    first bumps formed on a principal surface of said first semiconductor region in a region outside said light-receiving region; and
    a second bump formed in a ring-shape around said light-receiving region between said light-receiving region and said first bumps, said first and second bumps being solder bumps.

2. The semiconductor chip of claim 1, wherein said first bumps and said second bump have nearly the same height.

3. The semiconductor device of claim 1, wherein no bumps are formed inside the ringed shaped second bump.

4. A semiconductor device comprising:
    a semiconductor chip having a first semiconductor region of a first electroconductive type, a second semiconductor region of a second electroconductive type and formed at a surface of said first semiconductor region in a light-receiving region, said first and second semiconductor regions forming a photodiode, first bumps formed on a principal surface of said first semiconductor region in a region outside said light-receiving region, and a second bump formed in a ring-shape around said light-receiving region between said light-receiving region and said first bumps, said first and second bumps being solder bumps;
    an assembly substrate having electrodes formed at a surface thereof, wherein said semiconductor chip is assembled on said assembly substrate with said first bumps and second bump connected to said electrodes of the assembly substrate; and
    a resin layer that is formed between said semiconductor chip and said assembly substrate in a region outside of said light-receiving region, said resin layer bonding said semiconductor chip and said assembly substrate.

5. The semiconductor device of claim 4, wherein said first bumps and said second bump have nearly the same height.

6. The semiconductor device of claim 4, wherein said second bump becomes a dike for said resin layer.

7. The semiconductor device of claim 4, wherein a through-opening is formed on said assembly substrate in the region corresponding to said light-receiving region, and wherein said semiconductor chip is assembled on said assembly substrate such that said light-receiving region faces said through-opening.

8. A semiconductor device comprising:
    a semiconductor chip having a first semiconductor region of a first electroconductive type, a second semiconductor region of a second electroconductive type and formed at a surface of said first semiconductor region in a light-receiving region, said first and second semiconductor regions forming a photodiode, first bumps formed on a principal surface of said first semiconductor region in a region outside said light-receiving region, and a second bump formed in a ring-shape around said light-receiving region between said light-receiving region and said first bumps on said principal surface of said first semiconductor region, said first and second bumps being solder bumps
    an assembly substrate having electrodes formed at a surface thereof, wherein said semiconductor chip is assembled on said assembly substrate with said first bumps and second bump connected to said electrodes of the assembly substrate; and
    a resin layer that is formed between said semiconductor chip and said assembly substrate in a region outside of said light-receiving region, said resin layer bonding said semiconductor chip and said assembly substrate, wherein said first bumps and said second bump have nearly the same height, and wherein said second bump becomes a dike for said resin layer.

9. The semiconductor device of claim 8, wherein a through-opening is formed on said assembly substrate in the region corresponding to said light-receiving region, and wherein said semiconductor chip is assembled on said assembly substrate such that said light-receiving region faces said through-opening.

* * * * *